(12) United States Patent
Kobayashi et al.

(10) Patent No.: US 6,921,673 B2
(45) Date of Patent: Jul. 26, 2005

(54) NITRIDE SEMICONDUCTOR DEVICE AND METHOD OF MANUFACTURING THE SAME

(75) Inventors: Toshimasa Kobayashi, Kanagawa (JP); Katsunori Yanashima, Kanagawa (JP); Takashi Yamaguchi, Kanagawa (JP); Hiroshi Nakajima, Kanagawa (JP)

(73) Assignee: Sony Corporation, Tokyo (JP)

( * ) Notice: Subject to any disclaimer, the term of this patent is extended or adjusted under 35 U.S.C. 154(b) by 239 days.

(21) Appl. No.: 10/276,748

(22) PCT Filed: Mar. 27, 2002

(86) PCT No.: PCT/JP02/02980

§ 371 (c)(1),
(2), (4) Date: Nov. 19, 2002

(87) PCT Pub. No.: WO02/078069

PCT Pub. Date: Oct. 3, 2002

(65) Prior Publication Data

US 2003/0139037 A1 Jul. 24, 2003

(30) Foreign Application Priority Data

Mar. 27, 2001 (JP) ........................................ 2001-090893

(51) Int. Cl.$^7$ .............................................. H01L 21/00
(52) U.S. Cl. ........................ 438/22; 438/481; 438/681; 117/95
(58) Field of Search ........................... 438/22, 681, 481; 117/95

(56) References Cited

U.S. PATENT DOCUMENTS

| | | | | |
|---|---|---|---|---|
| 6,153,010 A | * | 11/2000 | Kiyoku et al. | ................. 117/95 |
| 6,265,289 B1 | * | 7/2001 | Zheleva et al. | ............. 438/503 |
| 6,355,497 B1 | | 3/2002 | Romano et al. | |
| 6,413,627 B1 | * | 7/2002 | Motoki et al. | ............... 428/332 |
| 6,500,257 B1 | * | 12/2002 | Wang et al. | .................... 117/95 |
| 6,582,986 B2 | * | 6/2003 | Kong et al. | ..................... 438/48 |
| 6,836,498 B2 | * | 12/2004 | Takeya et al. | ................. 372/45 |
| 2001/0007242 A1 | * | 7/2001 | Davis et al. | ................. 117/104 |
| 2003/0111008 A1 | * | 6/2003 | Strittmatter et al. | ........... 117/95 |

FOREIGN PATENT DOCUMENTS

| | | |
|---|---|---|
| EP | 1052684 | 11/2000 |
| JP | 2000-232239 | 8/2000 |
| JP | 2000-323417 | 11/2000 |
| JP | 2000-331937 | 11/2000 |
| JP | 2001-257166 | 9/2001 |
| JP | 2001-257193 | 9/2001 |

* cited by examiner

*Primary Examiner*—Richard Elms
*Assistant Examiner*—Michael K. Luhrs
(74) *Attorney, Agent, or Firm*—Sonnenschein, Nath & Rosenthal LLP

(57) ABSTRACT

Provided is a nitride semiconductor device with high reliability and high flexibility in design and manufacture of the device. The nitride semiconductor device comprises a seed crystal portion (11) formed on a sapphire substrate (10) and having a mask (12) on one side surface thereof, and a GaN layer (15) grown on the sapphire substrate (10) and the seed crystal portion (11) through epitaxial lateral overgrowth. The GaN layer (15) is grown only from an exposed side surface of the seed crystal portion (11) which is not covered with the mask (12), so the lateral growth of the GaN layer (15) is asymmetrically carried out. Thereby, a meeting portion (32) is formed in the vicinity of a boundary between the seed crystal portion (11) and the mask (12) in a thickness direction of the GaN layer (15). Therefore, as the meeting portion (32) is formed in a position away from the center between the adjacent seed crystal portions (11) in a direction parallel to a surface of the substrate, a width $W_L$ of a lateral growth region is larger with respect to a pitch $W_P$ of the seed crystal potion (11), compared with conventional configurations.

5 Claims, 17 Drawing Sheets

⟨0001⟩

⟨11 2̄ 0⟩

⊙⟨1 1̄ 0 0⟩

NITRIDE SEMICONDUCTOR DEVICE AND METHOD OF MANUFACTURING THE SAME

TECHNICAL FIELD

The present invention relates to a nitride semiconductor device comprising a nitride compound semiconductor layer on a substrate and a method of manufacturing the same.

BACKGROUND OF THE INVENTION

Characteristics of Group III nitride compound semiconductors (hereinafter referred to as nitride compound semiconductors) such as GaN, AlGaN, GaInN, AlGaInN and AlBGaInN include that they have a larger band gap energy Eg than Group III-V compound semiconductors such as AlGaInAs and AlGaInP, and they are direct transition semiconductors.

Because of the characteristics, attention has been given to the nitride compound semiconductors as materials of semiconductor light emitting devices such as semiconductor laser devices which emit light in a short wavelength range from ultraviolet to green and light emitting diodes (LEDs) capable of emitting light in a wider wavelength range from ultraviolet to red.

These semiconductor light emitting devices are being widely applied as light sources for optical pickups of recording/reproduction of high-density optical disks, light sources of full-color displays and other light emitting devices in environmental fields, medical fields and so on.

Moreover, characteristics of these nitride compound semiconductors include, for example, that the nitride compound semiconductors have a high saturation velocity in a high electric field region, or when they are used as materials of a semiconductor layer and aluminum nitride (AlN) is used as an insulating layer at the formation of a MIS (Metal-Insulator-Semiconductor) structure, the semiconductor layer and the insulating layer can be continuously grown through crystal growth.

Because of the characteristics, attention has been given to the nitride compound semiconductors as materials of high-power high-frequency electronic devices.

Further, the nitride compound semiconductors have the following advantages: (1) they have higher thermal conductivity than GaAs or the like, so they are more suitable for the materials of high-power devices used at a high temperature, compared with GaAs, (2) they have superior chemical stability and higher hardness, so they are device materials with high reliability, and (3) they do not include arsenic (As) in AlGaAs, cadmium (Cd) in ZnCdSe or the like as a material, and do not require a source gas such as arsine ($AsH_3$) or the like, so they are compound semiconductor materials which include no environmental pollutant and no poison and have a low impact on environment.

A problem which arises when a semiconductor device with high reliability is made by the use of the nitride compound semiconductors is that there is no suitable substrate material. In other words, in obtaining a high-quality nitride compound semiconductor layer, the following problems with the nitride compound semiconductors and the substrate material arise.

(1) The nitride compound semiconductors such as GaN, AlGaN and GaInN are strained systems with mutually different lattice constants, so when a film made of a nitride compound semiconductor is formed on a substrate, or when nitride compound semiconductor layers are laminated, strict restrictions on the composition and the thickness of the nitride compound semiconductor layer or the like are imposed to obtain a good-quality crystal film without crystal defect such as crack.

(2) A high-quality substrate lattice-matched to GaN which is a typical nitride compound semiconductor has not been developed yet. For example, a high-quality GaAs substrate lattice-matched to GaAs and GaInP and a high-quality InP substrate lattice-matched to GaInAs have been developed, so it is desired to develop a high-quality GaN substrate in a like manner; however, the GaN substrate is under development.

(3) The substrate materials of the nitride compound semiconductors are required to have resistance to a high crystal growth temperature of approximately 1000° C., and to have resistance to deterioration and corrosion by an atmosphere of ammonia ($NH_3$) which is a material of nitride.

Under the above circumstances, there is no suitable substrate lattice-matched to the nitride compound semiconductors, specifically to GaN at present, so a sapphire ($\alpha$-$Al_2O_3$) substrate is often used as the substrate material.

While the sapphire substrate has an advantage in production control that high-quality 2-inch substrates or 3-inch substrates are stably supplied to markets, it has a technical disadvantage of a large lattice mismatch to GaN of 13%.

For example, even if a buffer layer is disposed between the sapphire substrate and a GaN layer to reduce the lattice mismatch so that a favorable single crystal layer of GaN is epitaxially grown, the defect density reaches, for example, $10^8$ $cm^{-2}$ to $10^9$ $cm^{-2}$. Therefore, it is difficult to maintain the operational reliability of the semiconductor device for a long time.

Moreover, the sapphire substrate has the following problems: (1) the sapphire substrate has no cleavage, so it is difficult to stably form a laser facet with high mirror reflectance, (2) sapphire is an insulator, so it is difficult to dispose an electrode on the back side of the substrate as in the case of a GaAs semiconductor laser device, and both of a p-side electrode and an n-side electrode must be disposed on the side of a laminate of the nitride compound semiconductor layers on the substrate, and (3) there is a large difference in the thermal expansion coefficient between the sapphire substrate and the GaN layer, so there are a number of restrictions in a process of forming the device, for example, that when a crystal growth film is thick, a large warp in the substrate occurs even at room temperature, and thereby a crack may occur.

In order to overcome the above problems so as to grow a high-quality nitride compound semiconductor crystal on the sapphire substrate, epitaxial lateral overgrowth (ELO) has been developed.

Referring to FIGS. 10A through 15B, first through fourth examples of conventional configurations of the GaN layer formed by the epitaxial lateral overgrowth will be described below. Incidentally, the configurations in the first through the fourth examples are applicable in the case of forming any other nitride compound semiconductor layer instead of the GaN layer.

The epitaxial lateral overgrowth exploits anisotropy of crystal growth rate that when the GaN layer is epitaxially grown, the growth rate is faster in a <11-20> direction which is a leftward or rightward direction in a paper surface in FIGS. 10A through 15B, and a lateral direction which is a <1-100> direction orthogonal to the paper surface than in a <0001> direction (a direction perpendicular to a c-surface) which is a upward direction in the paper surface. Further, in the first through the fourth examples, the epitaxial lateral overgrowth may be carried out in the <1-100> direction instead of the <11-20> direction which is the lateral direction in the paper surface in FIGS. 10A through 15B. The symbol "-" inside the angle brackets is supposed to be attached above a number at the right of the symbol "-" as shown in FIG. 10C which is described later, however in this specification, the symbol is attached before the number for the sake of convenience.

FIGS. 10A and 10B show the first example. In the configuration of the first example, as shown in FIG. 10A, on a sapphire substrate 10 on which a seed crystal layer 11A is formed, a plurality of masks 12 which is made of an insulating film of silicon oxide (SiO$_2$), silicon nitride (SiN) or the like, or a multilayer film including a plurality of the insulating films is formed in stripes, and then as shown in FIG. 10B, a GaN layer 15 which is a crystal layer is laterally grown on the seed crystal layer 11A by ELO so as to cover the masks 12.

Further, FIG. 10C shows that in FIGS. 10A and 10B, the upward direction in the paper surface, the lateral direction in the paper surface and the direction orthogonal to the paper surface correspond to the <0001> direction (a direction perpendicular to the c-surface), the <11-20> direction and the <1-100> direction, respectively. The same is true in FIGS. 1 through 8E and FIGS. 11A through 17B.

FIGS. 11A and 11B shows the second example. In the second example, after the seed crystal layer 11A is formed all over the sapphire substrate 10, for example, a SiO$_2$ film is formed on the seed crystal layer 11A so as to form the mask 12 in a stripe shape, and then as shown in FIG. 11A, by the use of the mask 12, the seed crystal layer 11A is selectively etched until the sapphire substrate 10 is exposed, thereby a seed crystal portion 11 is formed. At this time, a top portion of the sapphire substrate 10 is selectively etched by the use of the mask 12 so as to form a gap 31.

Next, as shown in FIG. 11B, the GaN layer 15 is grown from side surfaces of the seed crystal portion 11 by the epitaxial lateral overgrowth. At this time, the gap 31 is formed between the sapphire substrate 10 and a lateral growth layer, so the growth is smoothly carried out.

FIGS. 12A and 12B show a modification of the second example. In this case, the seed crystal layer 11A with a relatively large film thickness is formed all over the sapphire substrate 10, and then as shown in FIG. 12A, an insulating film, for example, a SiO2 film is formed on the seed crystal layer 11A, and is patterned so as to form the mask 12 in a stripe shape. By the use of the mask 12, the seed crystal layer 11A is etched until the sapphire substrate 10 is exposed, thereby the seed crystal portion 11 is formed. Next, while the mask 12 remains on the seed crystal portion 11, as shown in FIG. 12B, the GaN layer 15 is grown from the side surfaces of the seed crystal portion 11 by the epitaxial lateral growth.

FIGS. 13A and 13B show the third example. As shown in FIG. 13A, in the third example, a configuration equivalent to the configuration of the second example shown in FIG. 11A without the mask 12 is formed.

Then, as shown in FIG. 13B, the GaN layer 15 is grown from the side surfaces, etc. of the seed crystal portion 11 by the epitaxial lateral growth.

FIGS. 14A and 14B show a modification of the third example. In this case, as shown in FIG. 14A, a configuration equivalent to the modification of the second example shown in FIG. 12A without the mask 12 is formed.

Then, as shown in FIG. 14B, the GaN layer 15 is grown from the side surfaces, etc. of the seed crystal portion 11 by the epitaxial lateral growth.

Further, in the third example and the modification thereof, after the seed crystal layer 11A is etched by the use of the mask 12 so as to form the seed crystal portion 11, the mask 12 is removed, and then the GaN layer 15 is laterally grown.

FIGS. 15A and 15B show the fourth example. In the fourth example, the seed crystal layer 11A with a relatively large film thickness is formed all over the sapphire substrate 10, and then as shown in FIG. 15A, an top portion of the seed crystal layer 11A is selectively etched so as to form a projected portion 13 in a stripe shape, thereby the seed crystal portion 11 is formed. After that, the mask 12 is formed on the seed crystal layer 11A except for the top surface of the seed crystal portion 11 and its surroundings. Next, as shown in FIG. 15B, the GaN layer 15 is grown from the top surface and its surroundings of the seed crystal portion 11 by the epitaxial lateral overgrowth.

In the first through the fourth examples and the modifications which are described above, as shown in FIGS. 10B, 11B, 12B, 13B, 14B and 15B, the GaN layer 15 includes a lateral growth region 21 and a high defect density region 22 or only the lateral growth region 21. For example, the lateral growth region 21 is an excellent crystal growth region, but on the other hand, in the high defect density region 22, due to lattice mismatch between the sapphire substrate 10 and GaN, or the like, a crystal defect are introduced from the seed crystal portion 11 with a high crystal defect density of $10^8/cm^2$ or over or the seed crystal layer 11A.

More specifically, the lateral growth region 21 is a region formed only through laterally growing GaN, so no crystal defect (dislocation) or a small number of crystal defects are introduced into the region from the seed crystal portion 11 or the seed crystal layer 11A. Therefore, the region is a high-quality GaN layer, that is, a low defect density region.

On the other hand, the high defect density region 22 is a high defect density region into which the crystal defects are introduced from the seed crystal portion 11 or the seed crystal layer 11A. Further, even in the lateral growth region 21, a region where the lateral growth regions 22 are met each other, that is, a region in the vicinity of a meeting portion 32 indicated by a solid line is a high defect density region.

The crystal defect includes screw dislocation, mixed dislocation and edge dislocation, and the defects which occurs in the high defect density region 22 or the region in the vicinity of the meeting portion 32 are mainly the screw dislocation and the mixed dislocation, so a dislocation extending substantially in a c-axis direction (upward in the drawings) is large.

Moreover, in the second example and the modification thereof, as shown in FIGS. 11B and 12B, the GaN layer 15 includes only the lateral growth region 21, which is the low defect density region, although the meeting portion 32 which is the high defect density region is formed. Further, as indicated by a line, a dislocation 33 often occurs in the vicinity of an end of the mask 12.

In the third example and the modification thereof, as shown in FIGS. 13B and 14B, the lateral growth region 21 which is the low defect density region and the high defect density region 22 which is a regrowth layer directly on the seed crystal portion 11 are comprised.

A method of reducing the high defect density region 22 by carrying out first lateral growth, and then carrying out second lateral growth in a position shifted a half cycle of a pattern with a projection and a depression from a position where the first lateral growth is carried out has been proposed. However, defects or the like in the meeting portion still remain, so a high-quality GaN layer cannot be formed all over the substrate.

Thus, even in the first through the fourth examples and combinations of the examples, it is difficult to obtain a substrate with a low defect density as a whole.

It is considered that when the thickness of a crystal growth film including a device portion such as the semiconductor laser device is nearly equal to the cycle of the crystal portion or the mask, a defect distribution during growth in a substantially lateral direction is reflected to the uppermost surface of a laminate including the device portion, so crystal defects occur in the device portion.

Therefore, in order to form the nitride semiconductor device having an excellent GaN layer without defect, it is required to form the semiconductor device on a region not including the high defect density region or a high defect density region in the vicinity of the meeting portion, that is, the lateral growth region.

As an example of the nitride semiconductor device, the configuration of a GaN semiconductor laser device will be described below referring to FIG. 16. The GaN semiconductor laser device comprises the GaN layer 15, and a laminate including an n-side contact layer 41, an n-side cladding layer 42, an active layer 43, a p-side cladding layer 44 and a p-side contact layer 45, all of which are made of a nitride compound semiconductor, in this order on the sapphire substrate 10 with the seed crystal portion 11 in between.

In the laminate, an upper portion of the p-side cladding layer 44 and the p-side contact layer 45 are formed as a laser stripe portion 50 extending in a ridge stripe shape in one direction. As the laser stripe portion 50 is a main device component which emits light when an injected current passes therethrough, the laser stripe portion 50 is aligned so as to be located on the lateral growth region 21 away from the high defect density region 22.

An upper portion of the n-side contact layer 41, the n-side cladding layer 42, the active layer 43 and a bottom portion of the p-side cladding layer 44 are formed as a mesa portion extending in the same direction as the direction in which the laser stripe portion 50 extends.

Further, a protective film 49 made of a SiN film is formed all over the surface, and through apertures disposed in the protective film 49, a p-side electrode 46 and a p-side contact electrode 46A are formed on the p-side contact layer 45 and an n-side electrode 47 and an n-side contact electrode 47A are formed on the n-side contact layer 41.

In order to design and form the semiconductor laser device with excellent laser properties and high reliability, it is important to form the laser stripe portion 50 on the lateral growth region 21, not on the high defect density region 22 and the meeting portion 32.

Referring to the third example and the modification thereof as examples and FIGS. 13B and 14B, a relationship between a width $W_L$ of the lateral growth region 21 and a pitch $W_P$ (the sum of a width of the seed crystal portion 11 and a width of a region between adjacent seed crystal portions 11) of the seed crystal portion 11 will be described below.

Assuming that the pitch $W_P$ is 15 μm and a width $W_O$ of the seed crystal portion 11 is 3 μm, the high defect density region 22 directly on the seed crystal portion 11 has a low quality because the crystal defects in the seed crystal portion 11 are introduced into the high defect density region 22, however, the other region with a width of $W_P-W_O=15-3=12$ μm, that is, the lateral growth region 21 is the low defect density region, that is, a high-quality region.

However, in fact, as shown in FIG. 13B or 14B, the GaN layer 15 is formed through laterally growing GaN crystals from both side surfaces of the seed crystal portion 11, so in the meeting portion 32, the crystals are not fully matched, thereby resulting in the occurrence of defects. Therefore, the width $W_L$ of the lateral growth region having a continuous low defect density is one-half of the width of $W_P-W_O$, that is, $W_L=6$ μm.

Next, referring to FIG. 16, the alignment of the laser stripe portion 50 of the GaN semiconductor laser will be described below. In order to obtain the GaN semiconductor laser device with high reliability, as described above, the overall width of the laser stripe portion 50 is required to be arranged on the lateral growth region 21.

For example, assuming that a width $W_T$ of the laser stripe portion 50 is 2 μm and the width $W_L$ is 6 μm, and the width of the meeting portion 32 is not taken into account, in order to arrange the laser stripe portion 50 within $W_L=6$ μm, the alignment accuracy is required to be ±2 μm.

Further, when the cycle of the laser stripe portion 50 is designed to be an integral multiple of a cycle of the seed crystal portion 11, a periodic configuration can be formed on the whole surface of a wafer.

Moreover, in the configurations shown in FIGS. 10A through 15B, a length of a resonator of a laser in a depth direction of the paper surface is, for example, 200 μm to 1000 μm or over, so compared with the width $W_T$ of the laser stripe portion 50, it is sufficiently long so that the same sectional shape can be formed. Therefore, there is no problem in forming the configuration in this direction.

For example, when the substrate material and the crystal film are both transparent, even if a reference position is confirmed by the buried mask 12, the gap 31 or the like so as to align the laser stripe portion 50, in fact, it is often difficult to accurately align the laser stripe portion 50 directly on the lateral growth region 21 not including the meeting portion 32 with high controllability and the above alignment accuracy of ±2 µm, because of the following restrictions.

The restrictions include: (1) the high defect density region 22 directly on the seed crystal portion 11 expands in the thickness direction (in the upward direction in the drawings), (2) the spreading width of the meeting portion 32 is not zero but, for example, approximately 0.5 µm to 1 µm, (3) it is technically difficult to expand the lateral growth region 21, and the width $W_L$ of the lateral growth region 21 has an upper limit because of crystal quality control of the lateral growth, (4) the width $W_O$ of the seed crystal portion 11 has a lower limit of, for example, 1 µm to 2 µm, and (5) in order to align the laser stripe portion 50 by seeing through the substrate, the alignment accuracy is approximately 1 µm to 2 µm.

Because of these restrictions, for example, in the third example (refer to FIG. 13B), $W_P=W_O+2\times W_L$, $W_P>2\times W_L$, that is, the width $W_L$ of the lateral growth region 21 is designed to be ½ or less of the pitch $W_P$ of the seed crystal portion 11 at the maximum.

Further, the value of the pitch $W_P$ cannot be freely increased, as described in the above restriction (3) on the crystal growth. For example, the upper limit of the pitch $W_P$ is approximately 10 µm, so there is a restriction on the upper limit of the width $W_L$.

Thus, in spite of the fact that the sum of the widths $W_L$ of the lateral growth region 21 is $2\times W_L$, there is the meeting portion 32 with poor crystal quality because the adjacent lateral growth regions 21 are met each other, so in substance, a region of only half of the widths $2\times W_L$ can be used to arrange the overall width of the laser stripe portion 50.

Moreover, for example, in MOCVD (Metal Organic Chemical Vapor Deposition), the epitaxial growth is carried out while keeping growth conditions in equilibrium, so even if the flow direction of, for example, a source gas crosses the seed crystal portion 11, the meeting portion 32 is formed in a position near the center between the adjacent seed crystal portions 11.

In the above description, although problems are described referring to the GaN layer as an example, they are universal problems when a laminate of the nitride compound semiconductor layers is formed.

In view of the foregoing, it is an object to provide a nitride semiconductor device having higher reliability and capable of increasing the flexibility in device design and a manufacturing margin, and a method of manufacturing the same.

SUMMARY OF THE INVENTION

The inventors of the present invention focused attention on the fact that in the conventional configurations, the lateral growth of a GaN layer between adjacent seed crystal portions was symmetrically carried out from both sides of the seed crystal portions, and lateral growth regions met each other at the center between the adjacent seed crystal portions to form a meeting portion, so the inventors had a conception of the invention that the lateral growth of the GaN layer was asymmetrically carried out so as to form the meeting portion in a position away from the center between the adjacent seed crystal portions, thereby the width of the lateral growth region is increased. The conception was confirmed by experiments, and the present invention was achieved.

A first nitride semiconductor device according to the invention comprises a plurality of seed crystal portions made of a nitride compound semiconductor and formed in stripes, and a crystal layer including a lateral growth region made of a nitride compound semiconductor and grown from the seed crystal portions as bases and a meeting portion on a substrate, wherein the meeting portion is formed in a position away from a center between adjacent seed crystal portions in a direction parallel to a surface of the substrate.

A second nitride semiconductor device according to the invention comprises a seed crystal layer made of a nitride compound semiconductor, a plurality of masks formed in stripes on the seed crystal layer, and a crystal layer including a lateral growth region made of a nitride compound semiconductor and grown on the seed crystal layer with the mask in between and a meeting portion on a substrate, wherein the meeting portion is formed in a position away from a center line of the mask orthogonal to a surface of the substrate in a direction parallel to the surface of the substrate.

A first method of a nitride semiconductor device according to the invention comprises the steps of: forming a plurality of seed crystal portions made of a nitride compound semiconductor in stripes on a substrate; forming a mask on one side surface of the seed crystal portion or on one side surface and a top surface of the seed crystal portion; and forming a crystal layer made of a nitride compound semiconductor from the seed crystal portions as bases.

A second method of manufacturing a nitride semiconductor device according to the invention comprises the steps of: forming a seed crystal layer made of a nitride compound semiconductor on a substrate; forming a plurality of masks having a shape with an end and the other end of different thicknesses in a laminated direction in stripes on the seed crystal layer; and forming a crystal layer made of a nitride compound semiconductor on the seed crystal layer with the masks in between.

In the first nitride semiconductor device according to the invention, the meeting portion is formed in a position away from the center between the adjacent seed crystal portions in a direction parallel to the surface of the substrate, so the width of the lateral growth region is increased with respect to a pitch of the seed crystal portion (the sum of the width of the seed crystal portion and the width of a region between the adjacent seed crystal portions), that is, the value of (the width of the lateral growth region)/(the pitch of the seed crystal portion) is large.

In the second nitride semiconductor device according to the invention, the meeting portion is formed in a position away from the center between the adjacent seed crystal portions in a direction parallel to the surface of the substrate, so the width of the lateral growth region is increased with respect to a pitch of the mask (the sum of the width of the mask and the width of a region between the adjacent masks), that is, the value of (the width of the lateral growth region)/(the pitch of the mask) is large.

In the first method of manufacturing a nitride semiconductor device according to the invention, the meeting portion is formed in a position away from the center between adjacent crystal portions in a direction parallel to the surface of the substrate in the crystal layer.

In the second method of manufacturing a nitride semiconductor device according to the invention, the meeting portion is formed in a position away from the center between adjacent masks in a direction parallel to the surface of the substrate in the crystal layer.

Other and further objects, features and advantages of the invention will appear more fully from the following description.

DETAILED DESCRIPTION OF THE PRESENTLY PREFERRED EMBODIMENTS

Preferred embodiments of the present invention will be described in more detail below referring to the accompanying drawings. Through the drawings of the embodiments, like components are denoted by like numerals as of the first through the fourth examples and modifications thereof and will not be further explained.

First Embodiment

Figure 1:
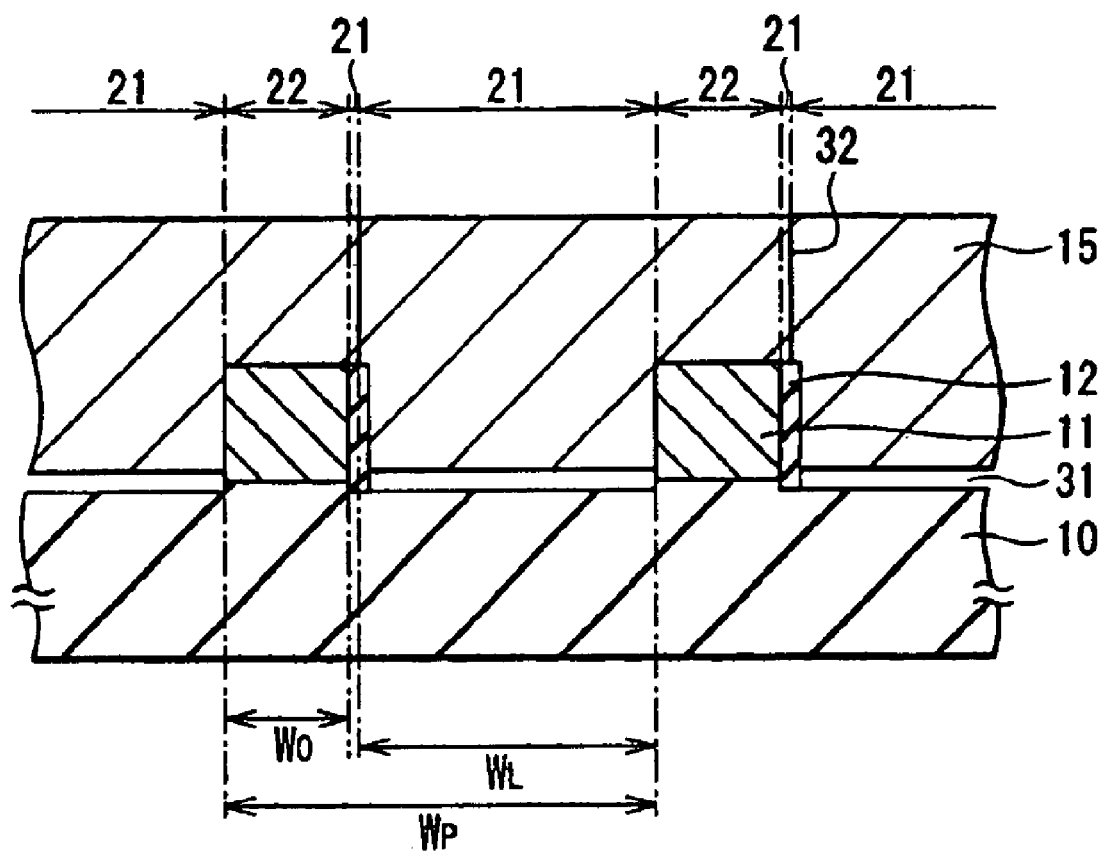
FIG. 1 is a cross sectional view showing a configuration of main components of a nitride semiconductor device according to a first embodiment of the invention.

FIG. 1 shows a configuration of main components of a nitride semiconductor device according to a first embodiment of the invention.

As shown in FIG. 1, the nitride semiconductor device mainly comprises a plurality of seed crystal portions 11 each of which is formed in a stripe shape on a sapphire substrate 10 and has a mask 12 on one side surface, and a GaN layer 15 which is a crystal layer grown on the sapphire substrate 10 and the seed crystal portions 11 through epitaxial lateral overgrowth.

In the configuration, the GaN layer 15 is grown only from an exposed side surface of the seed crystal portion 11 which is not covered with the mask 12, so the lateral growth of the GaN layer 15 is asymmetrically carried out, thereby a meeting portion 32 is formed in the vicinity of a boundary between the seed crystal portion 11 and the mask 12 in a thickness direction (laminated direction) of the GaN layer 15.

Figure 13A:
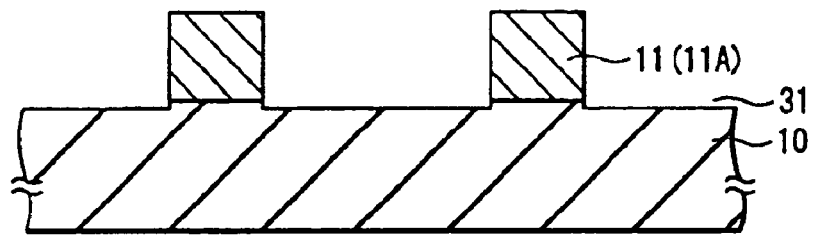
FIGS. 13A and 13B are cross sectional views of a third example.
Figure 13B:
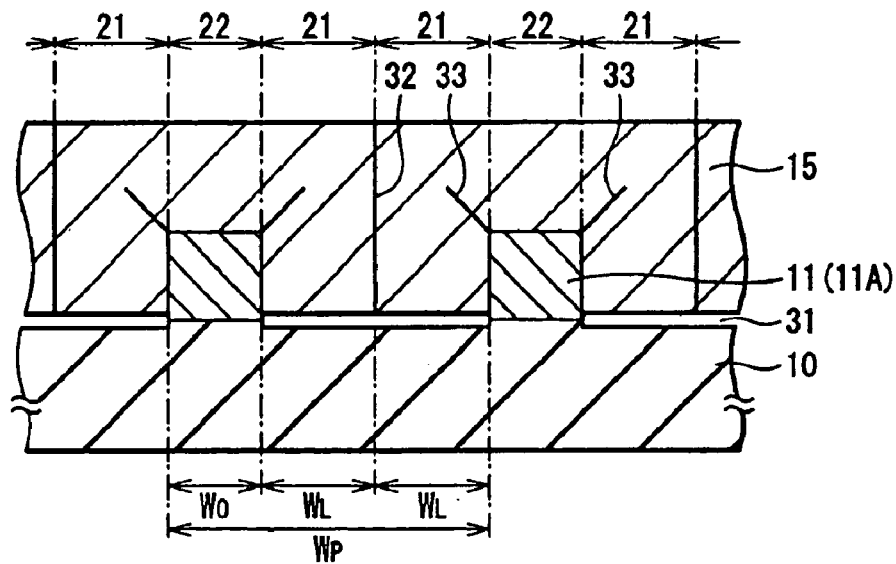
Figure 14A:
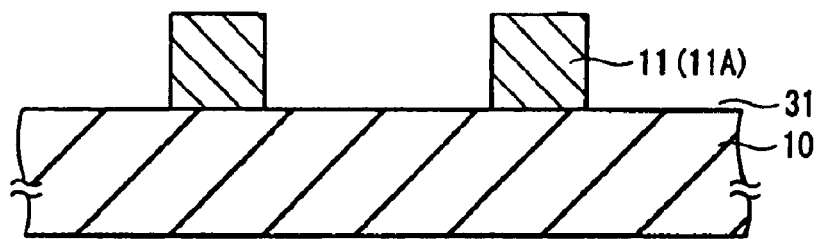
FIGS. 14A and 14B are cross sectional views of a modification of the third example.
Figure 14B:
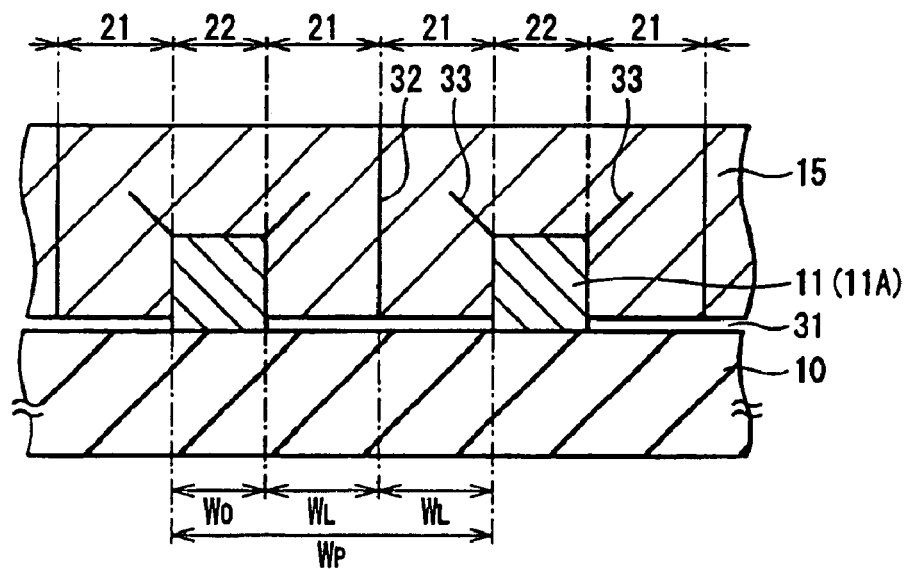
Figure 15A:
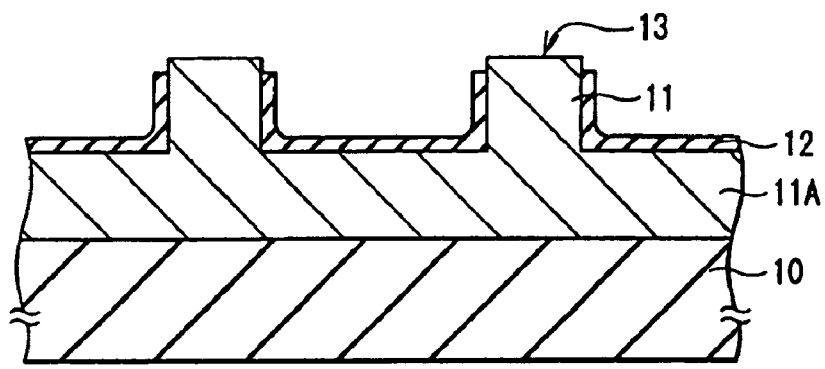
FIGS. 15A and 15B are cross sectional views of a fourth example.
Figure 15B:
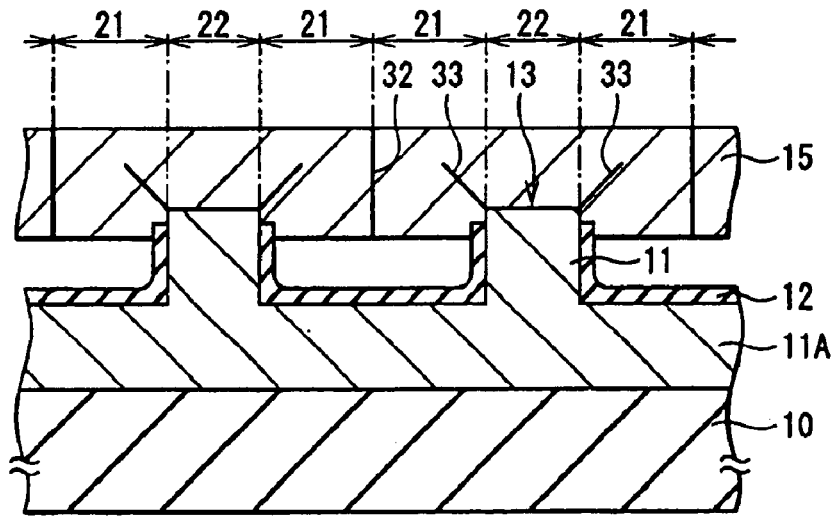

In conventional configurations, for example, as shown in FIG. 13B, the meeting portion 32 exists at the center between the adjacent seed crystal portions 11, whereas in the embodiment, the meeting portion 32 exists in the vicinity of the boundary between the seed crystal portion 11 and the mask 12.

Therefore, a width $W_L$ of the lateral growth region 21 with a largest width is indicated by the following relationship, assuming that a pitch of the seed crystal portion 11 is $W_P$ and a width of the crystal portion 11 is $W_O$:

$W_P \leq W_O + W_L$ and $W_L > W_O$, therefore $W_L > 0.5 \times W_P$.

Therefore, compared with the conventional configurations, a much larger value of the width $W_L$ can be obtained.

Figure 2A:
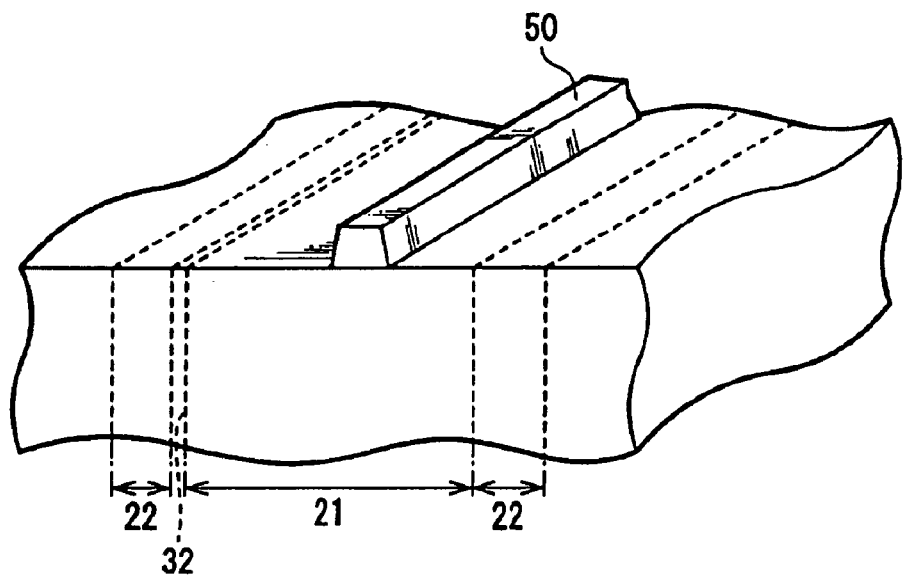
FIGS. 2A and 2B are schematic perspective views showing a relationship of an arrangement between a laser stripe portion and a lateral growth region in a GaN semiconductor laser device according to the first embodiment of the invention, and a relationship of an arrangement between a laser stripe portion and the a lateral growth region in a conventional GaN semiconductor laser device.
Figure 2B:
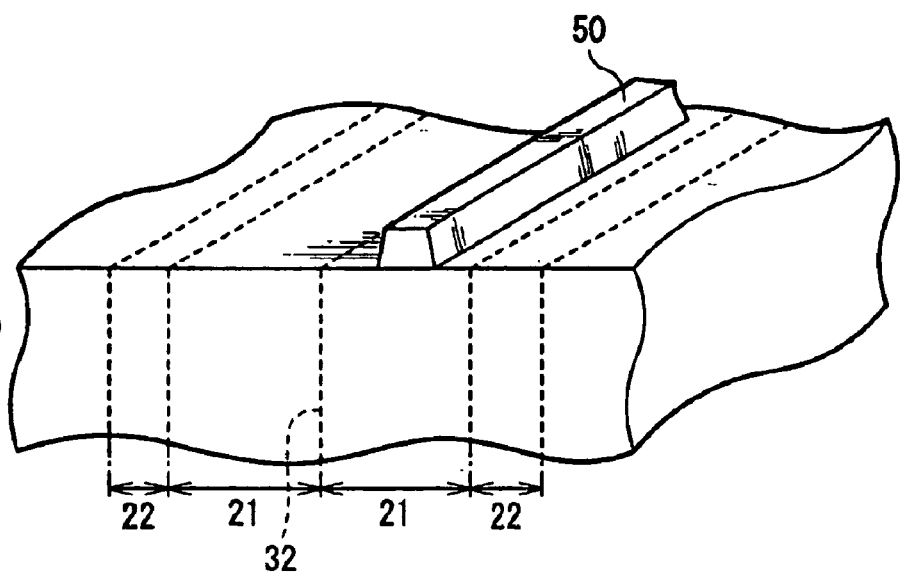
Figure 16:
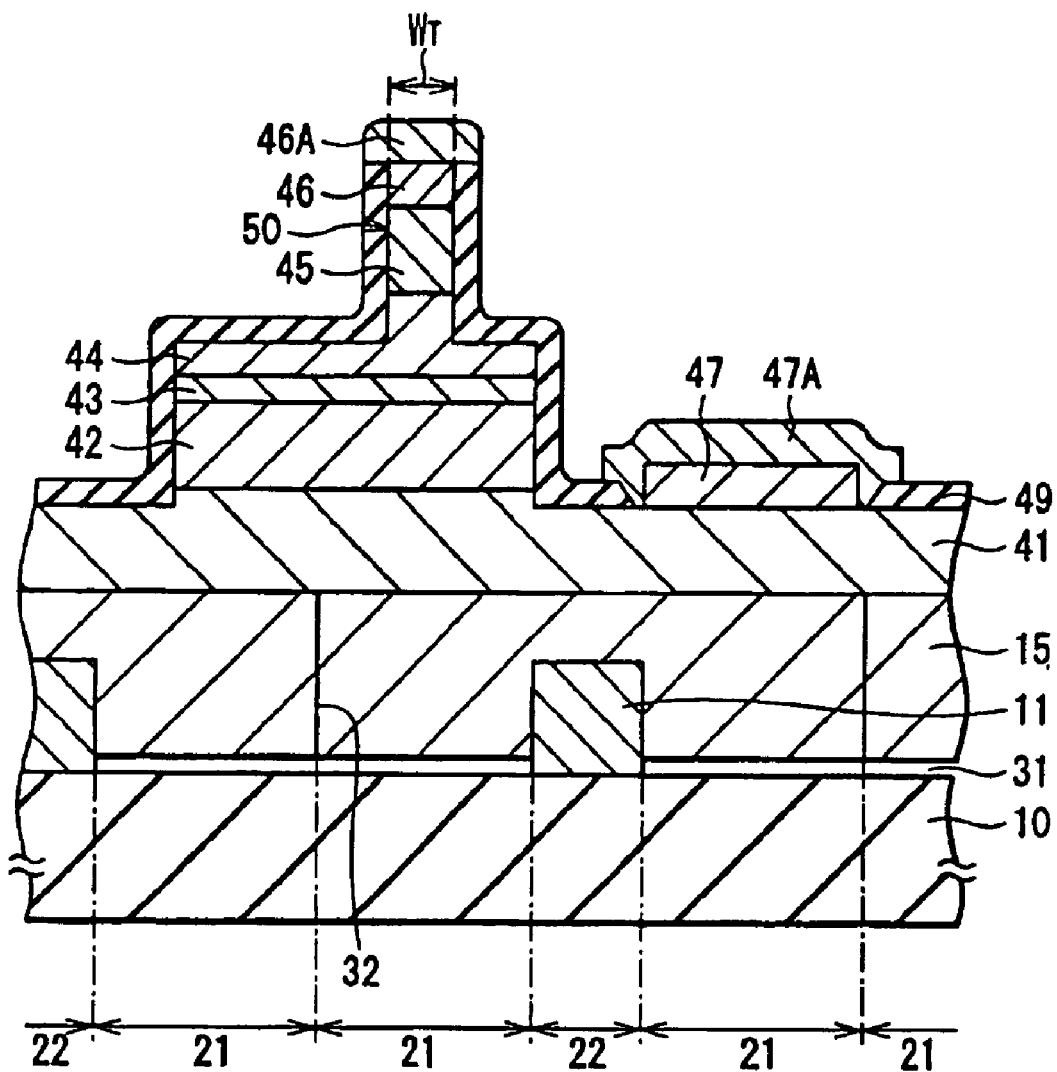
FIG. 16 is a cross sectional view showing a configuration of a conventional GaN semiconductor laser device.

When the nitride semiconductor device is applied to a GaN semiconductor laser device, as can be seen from a comparison between FIGS. 2A and 2B, it is extremely easier to arrange the laser stripe portion 50 of the GaN semiconductor laser device shown in FIG. 16 on the lateral growth region 21, compared with the conventional configurations. In other words, a margin of alignment increases.

Further, FIG. 2A shows a relationship of an arrangement between the laser stripe portion 50 and the lateral growth region 21 in the GaN semiconductor laser device according to the embodiment, and FIG. 2B shows a relationship of an arrangement between the laser stripe portion 50 and the lateral growth region 21 in the conventional GaN semiconductor laser device. The width of the lateral growth region 21 in FIG. 2A is much larger than that of the lateral growth region 21 in FIG. 2B.

Therefore, when the embodiment is applied, the GaN semiconductor laser device with less crystal defects and high reliability can be implemented.

Manufacturing Method

FIGS. 3A through 3D show a manufacturing process of the above nitride semiconductor device.

Figure 3A:
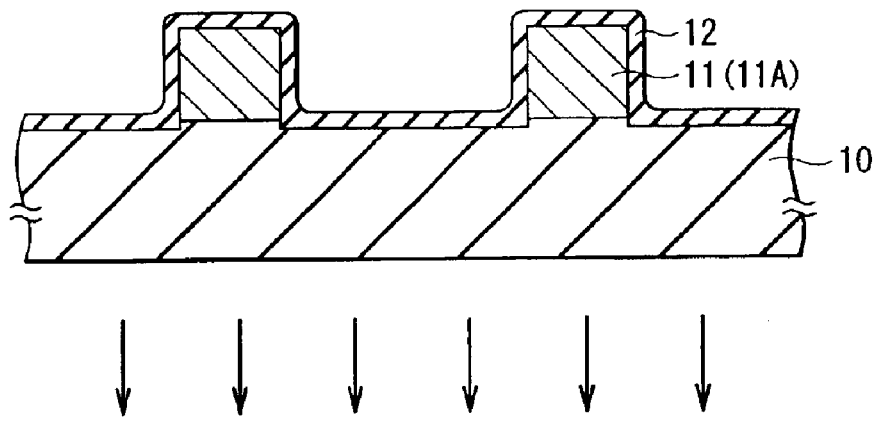
FIGS. 3A through 3D are cross sectional views showing a manufacturing process of the nitride semiconductor device according to the first embodiment of the invention.

At first, a seed crystal layer 11A is grown on, for example, the sapphire substrate 10, and then as shown in FIG. 3A, the seed crystal layer 11A is selectively etched to form a plurality of seed crystal portions 11 in stripes. Next, by CVD (Chemical Vapor Deposition) or the like, the mask 12 is formed all over the sapphire substrate 10. In addition, instead of the sapphire substrate 10, the seed crystal layer 11A may be formed on a GaN substrate.

Figure 3B:
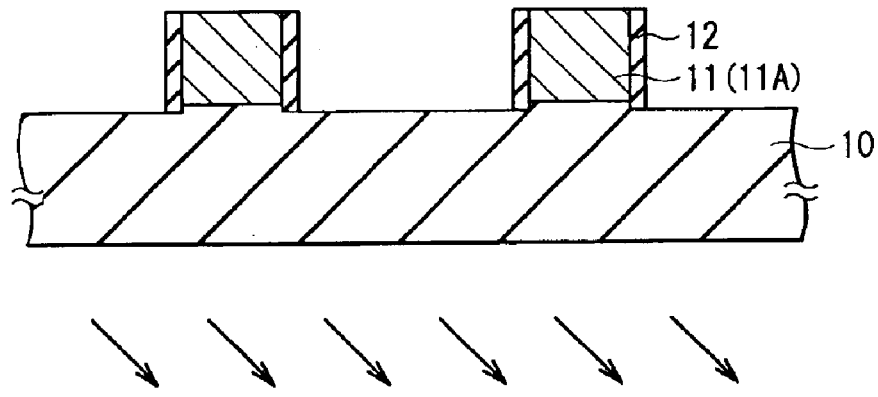

Next, as shown in FIG. 3B, by anisotropic etching, for example, RIE (Reactive Ion Etching), a top surface of the mask 12 is etched in a direction orthogonal to a surface of the sapphire substrate 10 to remain the mask 12 only on side surfaces of the seed crystal portion 11.

Figure 3C:
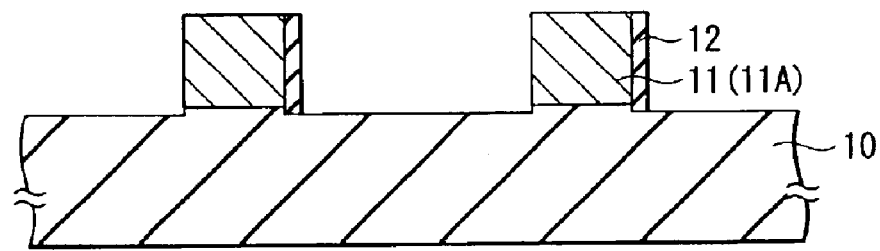
Figure 3D:
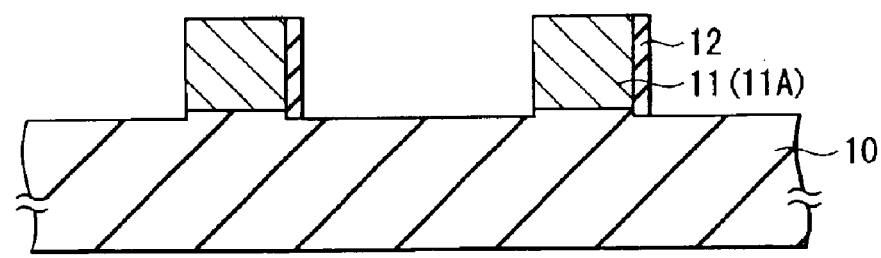

Then, as shown in FIG. 3C, the anisotropic etching is carried out in a diagonal direction to remove the mask 12 on one side surface of the seed crystal portion 11, and to remain the mask 12 on the other side surface of the seed crystal portion 11, as shown in FIG. 3D.

Next, as shown in FIG. 1, when the GaN layer 15 is grown through the epitaxial lateral overgrowth by the use of MOCVD, the GaN layer 15 is laterally grown only from the exposed side surface of the seed crystal portion 11 which is not covered with the mask 12, so the lateral growth of the GaN layer 15 is asymmetrically carried out, and the meeting portion 32 is formed in the vicinity of a boundary between the seed crystal portion 11 and the mask 12 in a thickness direction of the GaN layer 15.

Second Embodiment

Figure 4A:
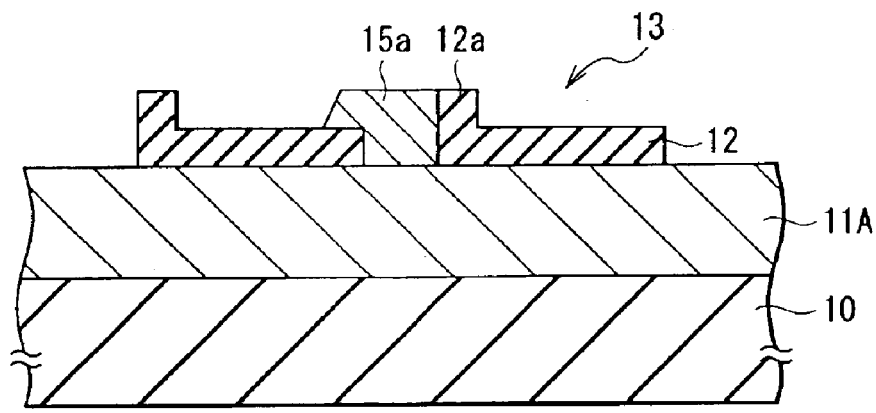
FIGS. 4A and 4B are cross sectional views showing a manufacturing process of a nitride semiconductor device according to a second embodiment of the invention.
Figure 4B:
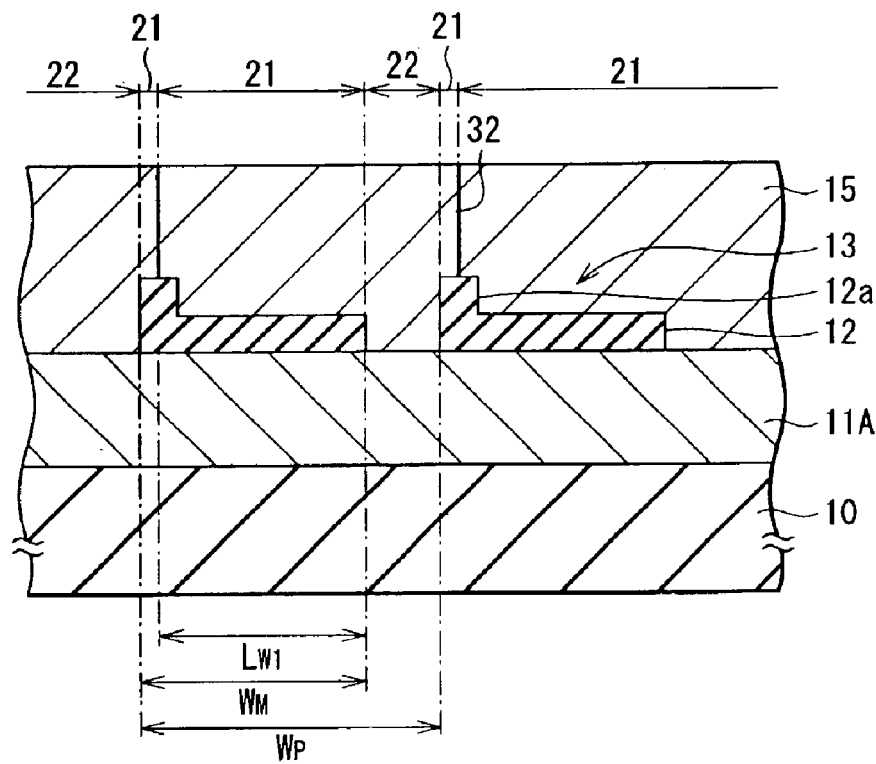

FIG. 4B shows a configuration of main components of a nitride semiconductor device according to a second embodiment of the invention.

As shown in FIG. 4B, the nitride semiconductor device improves the conventional nitride semiconductor device in the first example, and the nitride semiconductor device comprises the mask 12 which is disposed on the seed crystal layer 11A and has an end 12a with a larger thickness than other portions, and the GaN layer 15 which is a crystal layer grown on the seed crystal layer 11A through the epitaxial lateral overgrowth so as to cover the mask 12.

In the nitride semiconductor device, a time difference in the start of the lateral growth of the GaN layer 15 occurs because of the difference in the thickness of the mask 12, so the lateral growth is carried out asymmetrically with respect to the mask 12. As a result, the meeting portion 32 is formed not in the center of the mask 12 like the first example, but in a position in the vicinity of the end 12a.

Thereby, in the embodiment, as in the case of the first embodiment, the value of the width $W_L$ ($L_{w1}$ in FIG. 4B) can be larger, that is, $L_{W1} > \frac{1}{2} \times W_M$ ($W_M$ indicates the width of the mask 12). Therefore, as a margin for the design and the manufacture of the device increases, the design and the manufacture of the device become easier, and yield is enhanced.

Figure 10A:
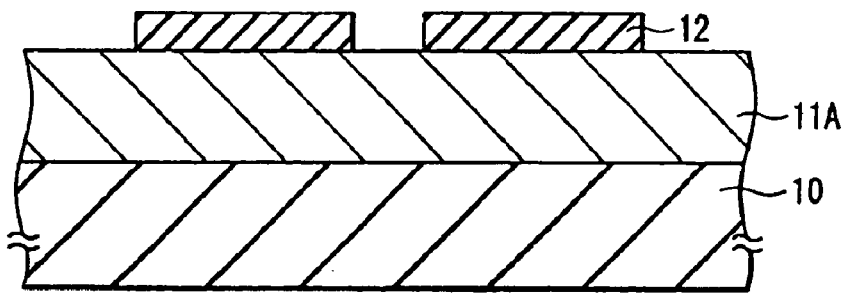
FIGS. 10A and 10B are cross sectional views showing a first example.
Figure 10B:
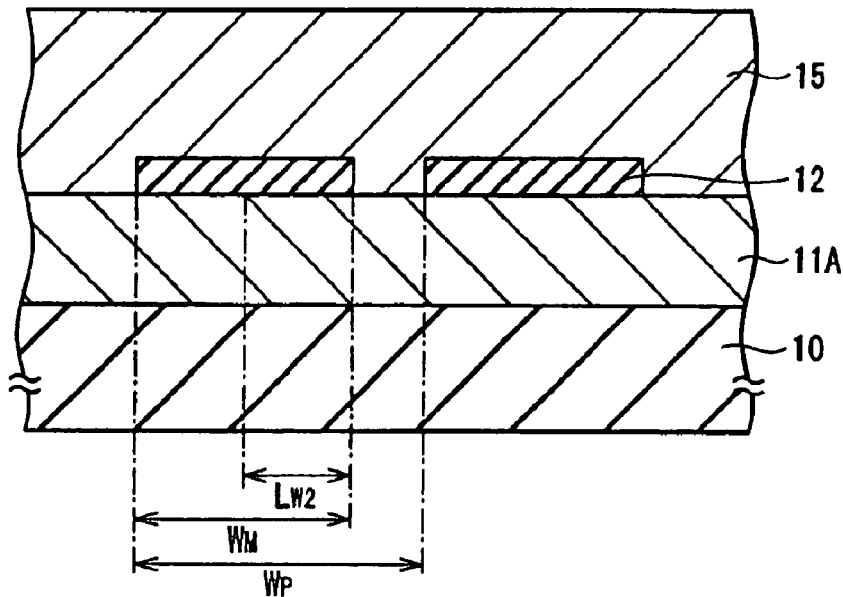
Figure 10C:
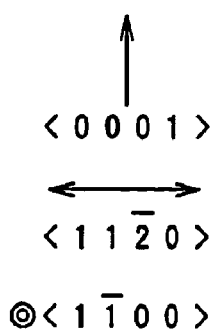
FIG. 10C is an illustration showing that an upward direction in a paper surface, a lateral direction in the paper surface and a direction orthogonal to the paper surface correspond to a <0001> direction (a direction perpendicular to a c-surface), a <11-20> direction and a <1-100> direction, respectively.
Figure 11A:
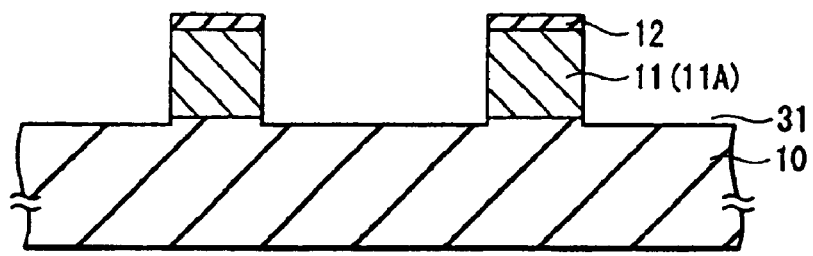
FIGS. 11A and 11B are cross sectional views of a second example.
Figure 11B:
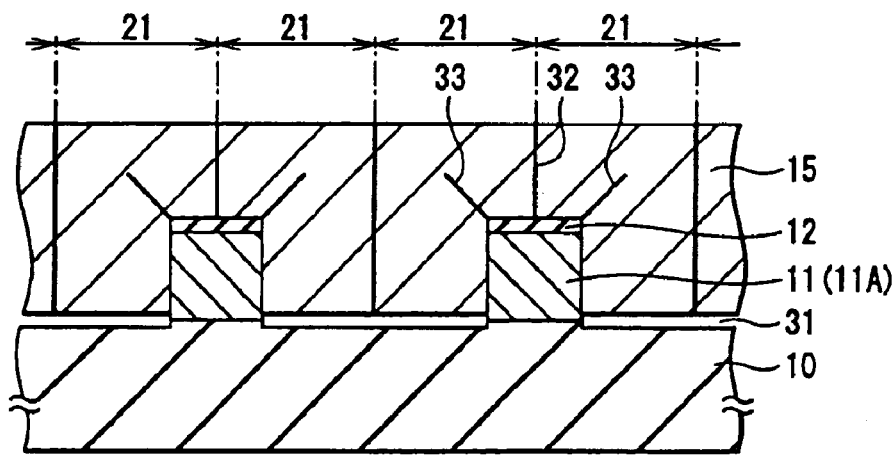
Figure 12A:
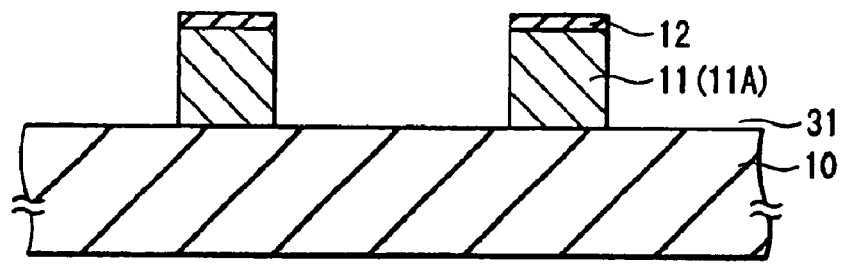
FIGS. 12A and 12B are cross sectional views of a modification of the second example.
Figure 12B:
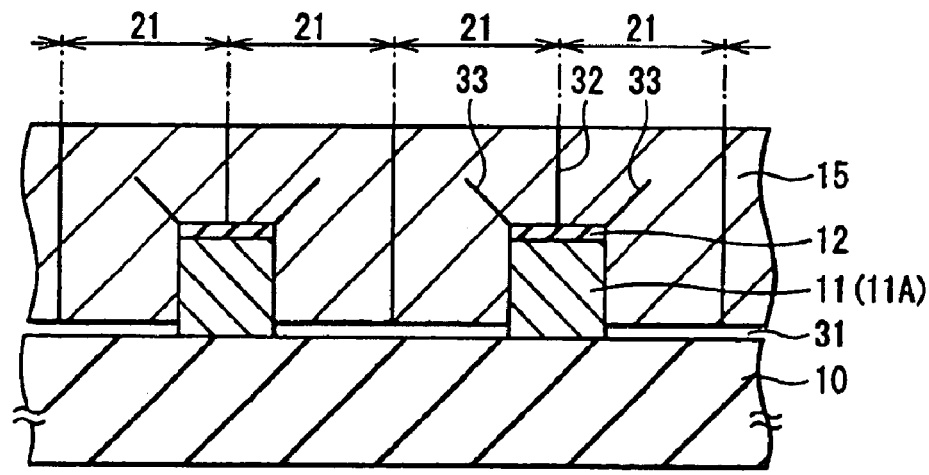

On the other hand, in the first example shown in FIG. 10B corresponding to the embodiment, the value of the width $W_L$ is $W_L = L_{W2} = \frac{1}{2} \times W_M$, so even if the pitch $W_P$ and the width $W_M$ are the same as those in the embodiment, the device according to the embodiment has the lateral growth region 21 with a larger width.

Manufacturing Method

FIGS. 4A and 4B show a manufacturing process of the above nitride semiconductor device.

At first, after a mask material is formed all over the seed crystal layer 11A, a plurality of masks 12 are formed through photolithography and etching, and then an end of each of the masks 12 is covered with a mask, and a portion exposed by dry etching is removed in partway. Thereby, as shown in FIG. 4A, the mask 12 having the end 12a with a larger thickness is formed on the seed crystal layer 11A.

Next, as shown in FIG. 4B, the GaN layer 15 is grown through the epitaxial lateral overgrowth by the use of the MOCVD.

In the embodiment, as shown in FIG. 4A, an epitaxial growth layer 15a formed through laterally growing the GaN layer 15 is selectively grown from a side of a portion of the mask 12 with a thinner thickness (a side opposed to the end 12a) to a side of a portion of the adjacent mask 12 with a larger thickness, so, as shown in FIG. 4B, the lateral growth region 21 becomes larger.

Third Embodiment

Figure 5:
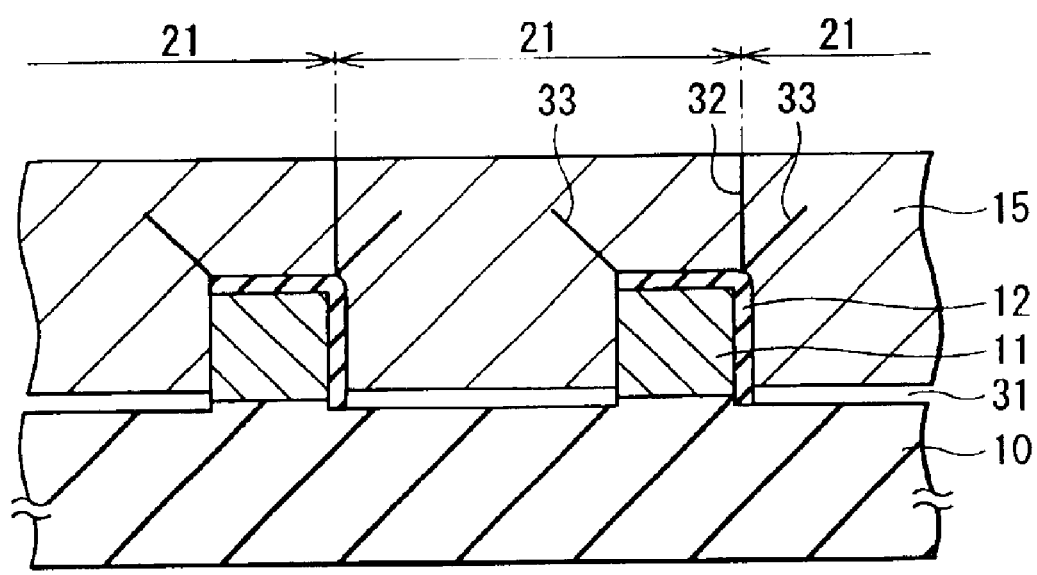
FIG. 5 is a cross sectional view showing a configuration of main components of a nitride semiconductor device according to a third embodiment of the invention.

FIG. 5 shows a configuration of main components of a nitride semiconductor device according to a third embodiment of the invention.

The nitride semiconductor device comprises a plurality of seed crystal portions 11 each of which is formed on the sapphire substrate 10 and has the mask 12 on the top surface and one side surface, and the GaN layer 15 which is a crystal layer grown on the sapphire substrate 10 and the seed crystal portions 11 through the epitaxial lateral overgrowth.

The lateral growth of the GaN layer 15 is carried out only from an exposed surface of the seed crystal portion 11 which is not covered with the mask 12, so the growth is asymmetric, and as shown in FIG. 5, the meeting portion 32 is formed in the vicinity of the boundary between the seed crystal portion 11 and the mask 12 disposed on the side surface of the seed crystal portion 11 in the thickness direction of the GaN layer 15.

In the embodiment, the meeting portion 32 is formed in a position away from the center between the adjacent seed crystal portions 11 in a direction parallel to the surface of the sapphire substrate 10, so the embodiment provides the same effects as the first and the second embodiments.

Manufacturing Method

FIGS. 6A through 6D show a manufacturing process of the above nitride semiconductor device.

Figure 6A:
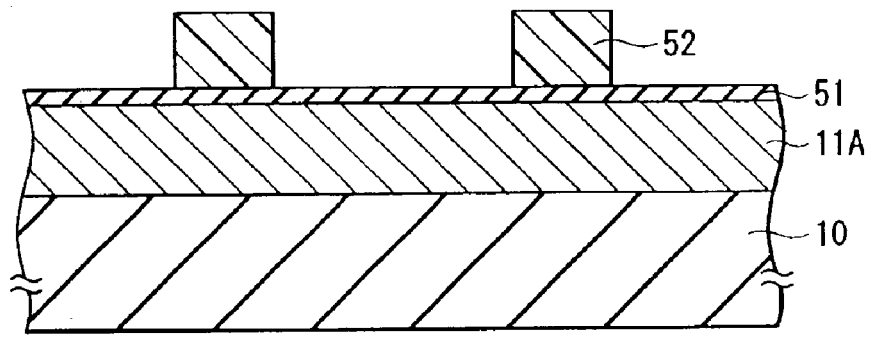
FIGS. 6A through 6D are cross sectional views showing a manufacturing process of the nitride semiconductor device according to the third embodiment of the invention.

At first, as shown in FIG. 6A, the seed crystal layer 11A is grown on the sapphire substrate 10, and a mask 51 and a resist film 52 is formed in this order.

Figure 6B:
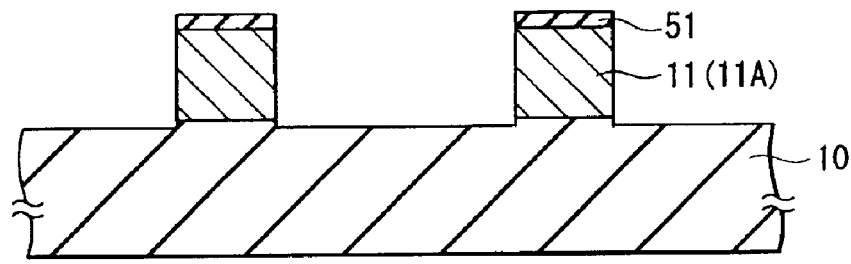

Next, as shown in FIG. 6B, by the use of the resist film 52, the mask 51 is etched, and further the seed crystal layer 11A is etched, thereby the seed crystal portion 11 with the mask 51 disposed thereon is formed.

Then, without removing the mask 51, as in the case of the first embodiment, a mask (not shown) is formed all over the substrate. Selections of the thicknesses and the materials of the mask (not shown) and the mask 51, etching conditions, time control and so on are adjusted, and the top surface of the mask (not shown) is etched through the anisotropic etching in a direction orthogonal to the surface of the sapphire substrate 10 so as to remain the mask only on the both side surfaces of the seed crystal portion 11. Further, through the anisotropic etching in a diagonal direction, the mask on one side surface of the seed crystal portion 11 is removed so as to remain the mask on the other side surface of the seed crystal portion 11.

Figure 6C:
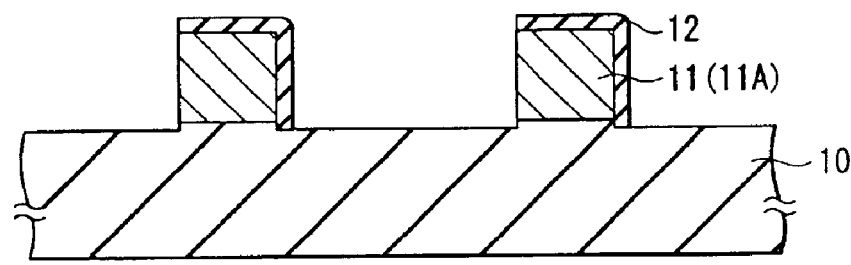

Thereby, as shown in FIG. 6C, the mask 12 can be formed on the top surface and one side surface of the seed crystal portion 11.

Next, when the GaN layer 15 is grown through the epitaxial lateral overgrowth by the use of the MOCVD, the GaN layer 15 is grown only from an exposed surface of the seed crystal portion 11 which is not covered with the mask 12, so the lateral growth of the GaN layer 15 is asymmetrically carried out, and thereby the meeting portion 32 is formed in the vicinity of the boundary between the seed crystal portion 11 and the mask 12 in the thickness direction of the GaN layer 15.

Figure 6D:
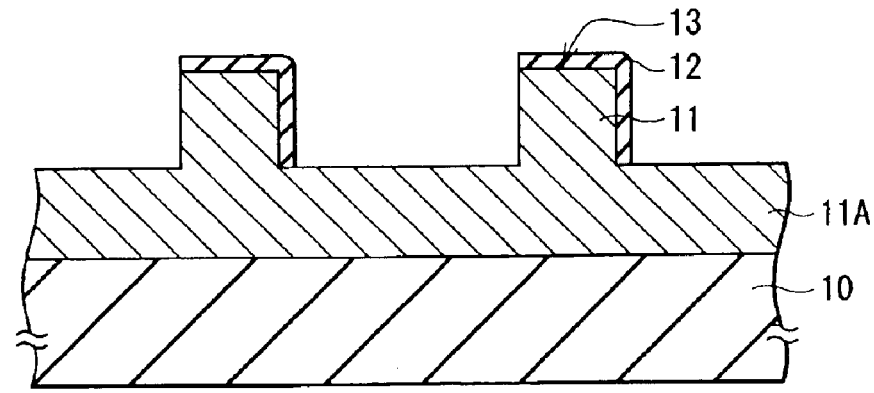

In the embodiment, as shown in FIG. 6D, the seed crystal portion 11 may be formed through forming the seed crystal layer 11A with a relatively large thickness on the sapphire substrate 10, and then selectively etching a top portion of the seed crystal layer 11A so as to form a projected portion 13 in a stripe shape.

Fourth Embodiment

Figure 7A:
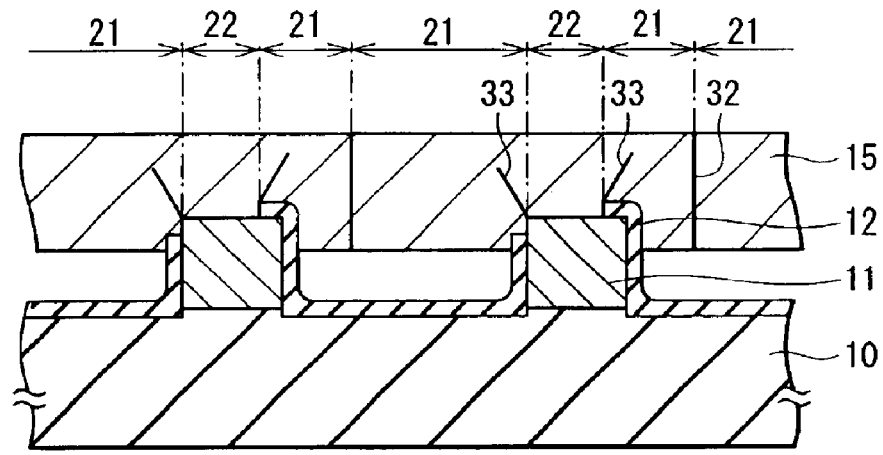
FIGS. 7A and 7B are cross sectional views showing a configuration of main components of a nitride semiconductor device according to a fourth embodiment of the invention.

FIG. 7A is a cross sectional view showing a configuration of main components of a nitride semiconductor device according to a fourth embodiment of the invention.

The embodiment improves the conventional nitride semiconductor device in the fourth example, and the nitride semiconductor device comprises a plurality of seed crystal portions 11 each of which is formed in a stripe shape on the sapphire substrate 10, the mask 12 which is formed on a portion of the sapphire substrate 10 corresponding to the both side surfaces of the seed crystal portion 11, a part of the top surface of the seed crystal portion 11 connecting to one side surface thereof and a region between the adjacent seed crystal portions 11, and the GaN layer 15 which is a crystal layer laterally grown on the mask 12 and the seed crystal portions 11.

In the embodiment, as in the case of the first through the third embodiments, the lateral growth of the GaN layer 15 is carried out from an exposed surface of the seed crystal portion 11 which is not covered with the mask 12, so the lateral growth of the GaN layer 15 is asymmetric, and the meeting portion 32 is formed in a position away from the center between the adjacent seed crystal portions 11. Therefore, as in the case of the first through the third embodiments, the value of the width $W_L$ becomes larger, so a margin for the design and the manufacture of the device increases, and thereby the design and the manufacture become easier, and yield is enhanced.

Figure 7B:
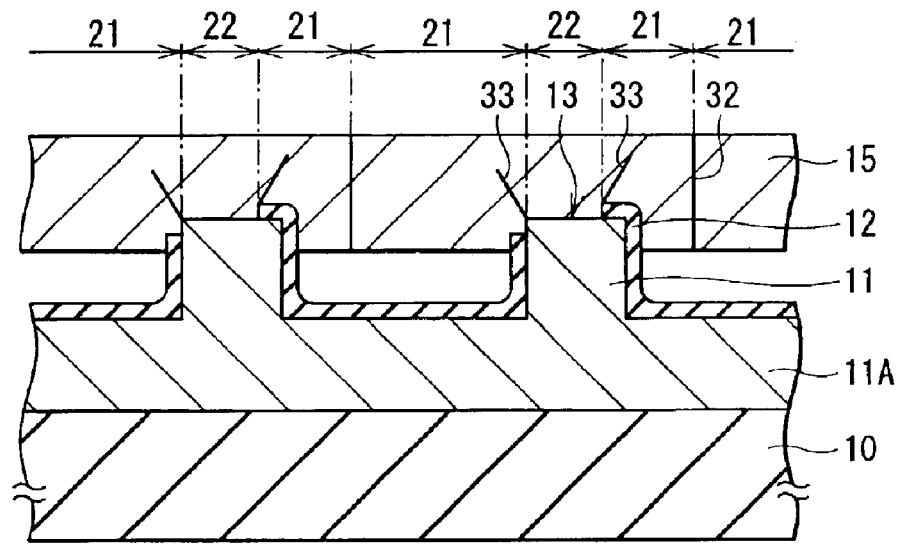

As shown in FIG. 7B, the nitride semiconductor device comprising the seed crystal layer 11A with the seed crystal portion 11 as the projected portion 13 provides the same effects as the above fourth embodiment.

Manufacturing Method

FIGS. 8A through 8E show a manufacturing process of the above nitride semiconductor device.

Figure 8A:
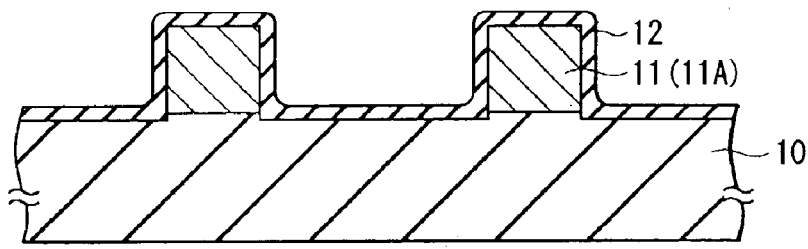
FIGS. 8A through 8E are cross sectional views showing a manufacturing process of the nitride semiconductor device according to the fourth embodiment of the invention.

At first, the seed crystal layer 11A is formed on the sapphire substrate 10, and then as shown in FIG. 8A, the seed crystal layer 11A is selectively etched to form a plurality of seed crystal portions 11 in stripes. Then, the mask 12 is formed on the sapphire substrate 10 and the seed crystal portions 11 through CVD or the like.

Figure 8B:
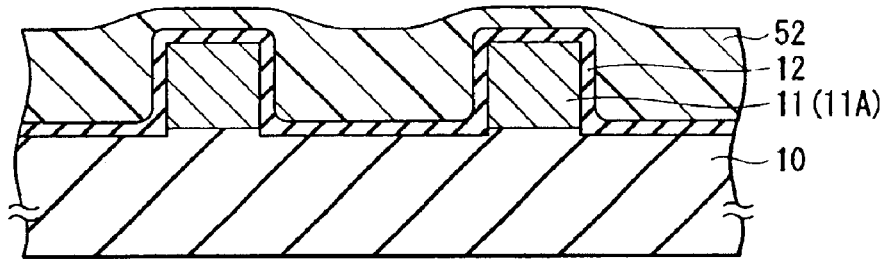
Figure 8C:
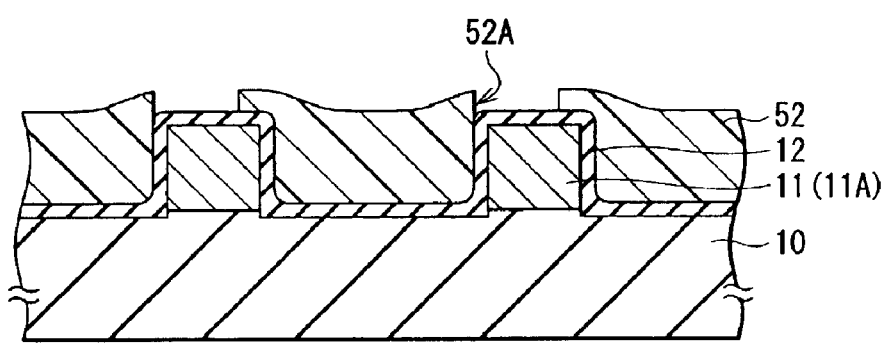

Next, as shown in FIG. 8B, the resist film 52 is coated so as to fill a region between the adjacent seed crystal portions 11. Then, as shown in FIG. 8C, an aperture 52A is created on the resist film 52 so as to expose a portion of the mask 12 on the top surface and one side surface of the seed crystal portion 11.

Figure 8D:
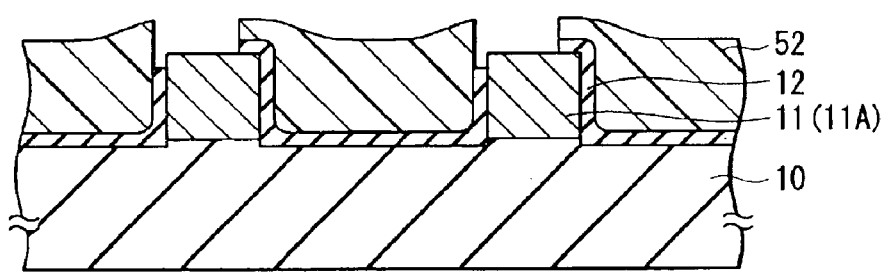
Figure 8E:
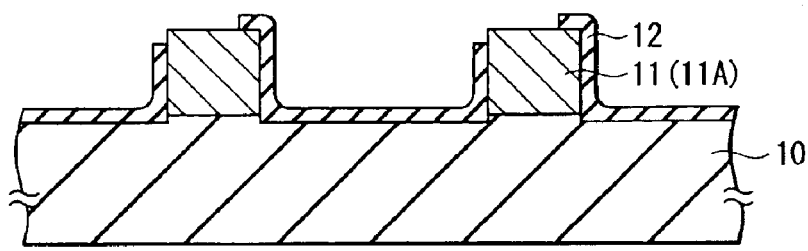

Next, as shown in FIG. 8D, through RIE by the use of carbon tetrafluoride ($CF_4$) gas or the like, the exposed portion of the mask 12 is etched and removed so as to expose the seed crystal portion 11. Then, as shown in FIG. 8E, the resist film 52 is removed.

Next, when the GaN layer 15 is laterally grown on the seed crystal portions 11 and the mask 12, the configuration shown in FIGS. 7A and 7B can be obtained.

Incidentally, the invention is applicable not only to the semiconductor laser device but also to a semiconductor optical device such as a light emitting diode (LED), a photodetector (PD) and a semiconductor electronic device such as a field-effect transistor (FET) and a bipolar transistor, and by applying the invention to the devices, the all of the devices have high reliability.

Figure 9:
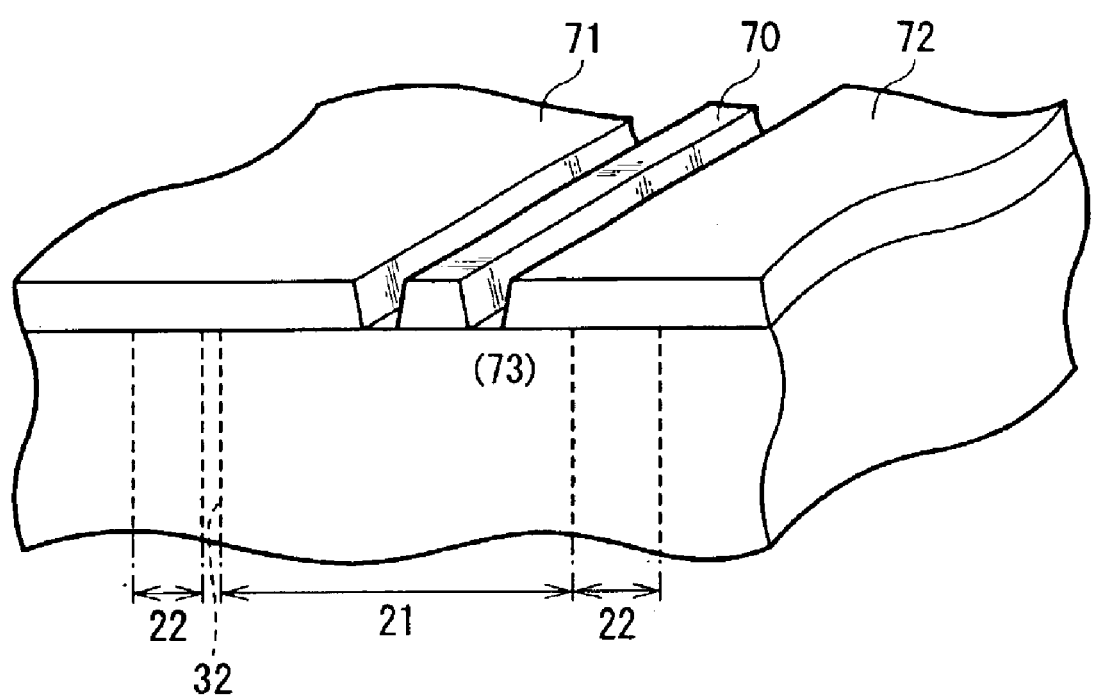
FIG. 9 is a schematic perspective view showing a relationship of an arrangement among a source region, a gate region, a drain region and a lateral growth region in a MOSFET according to the first through the fourth embodiments of the invention.

For example, in the case of a MOSFET (metal oxide semiconductor field-effect transistor), as shown in FIG. 9, a gate region 70, a source region 71 and a drain region 72, especially the gate region 70 and a channel region 73 can be formed on the lateral growth region 21 with the largest width. Moreover, in the case of the bipolar transistor, an emitter region, a base region and a collector region can be formed on the lateral growth region 21 with the largest width. Further, in the case of the photodetector, a photoreceptor unit can be formed on the lateral growth region 21. Still further, in the case of the light emitting diode, a light-emitting unit can be formed on the lateral growth region 21.

In the first through the fourth embodiments described above, the following technical ideas are common. In each of the nitride semiconductor devices, the lateral growth of the GaN layer 15 is asymmetrically carried out by the mask 12, so compared with the conventional configurations, the width $W_L$ of the lateral growth region 21 of the low defect density region can be increased. Thereby, the nitride semiconductor device can be more easily formed on the low defect density region, so the size of the device and the margin of alignment can be increased.

According to the invention, even if part of the operation portion of the device not the whole operation portion is included in the lateral growth region 21 with the largest width, the same effects may be obtained.

Further, in the first through the fourth embodiments, a general wafer process or a combination of the same crystal growth techniques as the conventional ones is applied, so there is no specific restriction in process to implement the embodiments of the invention.

Figure 17A:
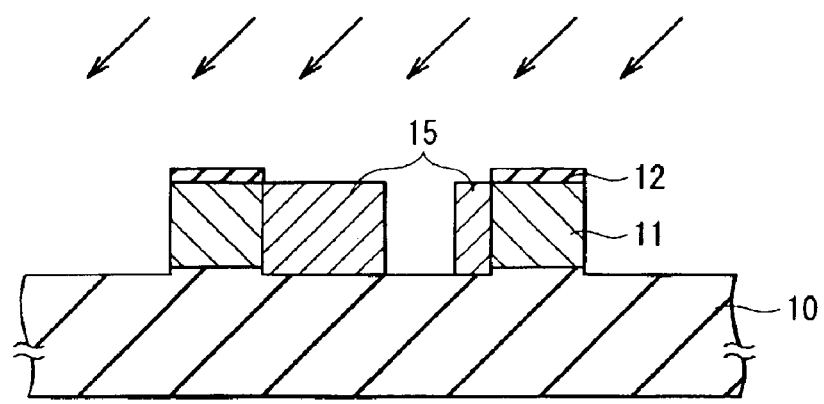
FIGS. 17A and 17B are cross sectional views showing a manufacturing process of a nitride semiconductor device according to a modification of the invention.
Figure 17B:
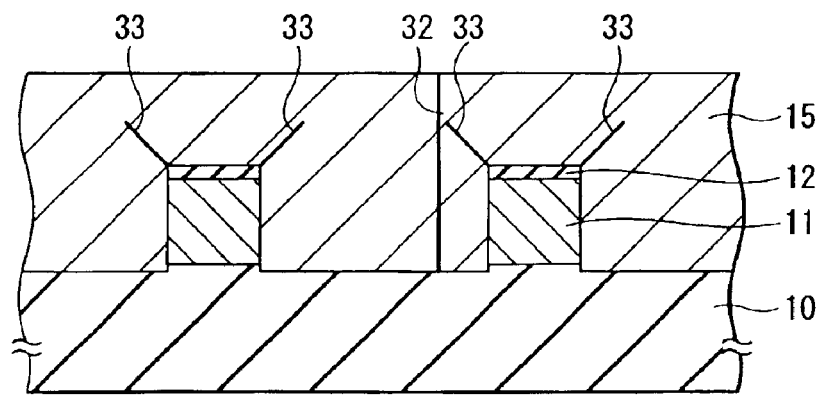

In the above embodiments, the GaN layer 15 is grown through the MOCVD. However, as shown in FIG. 17A, the GaN layer 15 may be laterally and asymmetrically grown from the side surfaces of the seed crystal portion 11 with the mask disposed on the top surface thereof by the use of molecular beam epitaxy (MBE) through entering a molecular beam into the surface of the sapphire substrate 10 at a shallow angle. When the growth of the GaN layer 15 is continued by the use of the MBE, as shown in FIG. 17B, the meeting portion 32 can be formed in a position away from the center between the adjacent seed crystal portions 11.

However, the MBE is less preferable than the MOCVD in terms of the lateral direction control, the quality of a growth layer and so on.

As described above, according to a first nitride semiconductor device of the invention, the meeting portion is formed in a position away from the center between the adjacent seed crystal portions in a direction parallel to the surface of the substrate, so the width of the lateral growth region can be larger with respect to the pitch of the seed crystal portion (the sum of the width of the seed crystal portion and the width of a region between the adjacent seed crystal portions). As a result, the size of the device and the margin of alignment can be increased, so the flexibility in design and manufacture can be increased, and the reliability of device properties can be improved.

Moreover, according to a second nitride semiconductor device of the invention, the meeting portion is formed in a position away from the center between adjacent masks in a direction parallel to the surface of the substrate, so the width of the lateral growth region can be larger with respect to the pitch of the mask (the sum of the width of the mask and the width of a region between the adjacent masks). As a result, the size of the device and the margin of alignment can be increased, so flexibility in design and manufacture can be increased and the reliability of device properties can be improved.

Further, according to a method of manufacturing the first and the second nitride semiconductor devices, after a plurality of seed crystal portions are formed in stripes on the substrate, the mask is formed on one side surface of the seed crystal portion or on one side surface and the top surface of the seed crystal portion, and then the crystal layer is formed from the seed crystal portion as a base, or after the seed crystal layer is formed on the substrate, a plurality of masks with a shape that the heights of one end and the other end in a laminated direction are different are formed in stripes on the seed crystal layer, and the crystal layer is formed on the seed crystal layer with the masks in between, so the lateral growth region with a larger width can be formed in the crystal layer. As a result, the size of the device and the margin of alignment can be increased, so the flexibility in design and manufacture can be increased and the reliability of device properties can be improved.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a nitride semiconductor device, comprising the steps of:

forming a seed crystal layer made of a nitride compound semiconductor on a substrate;

forming a plurality of masks having a shape with an end and the other end of different thicknesses in a laminated direction in stripes on the seed crystal layer; and forming a crystal layer made of a nitride compound semiconductor on the seed crystal layer with the masks in between.

2. A method of manufacturing a nitride semiconductor device according to claim 1, wherein a lateral growth reaion with a width greater than or equal to 0.5 times $W_p$ is formed on the seed crystal, wherein the sum of the width of the mask and the width of a region between adjacent masks is $W_P$.

3. A method of manufacturing a nitride semiconductor device according to claim 2, further comprising the step of:

forming a laser stripe portion so as to correspond to the lateral growth region, after the crystal layer is formed.

4. A method of manufacturing a nitride semiconductor device according to claim 2, further comprising the step of:

forming a source region, a gate region and a drain region so as to correspond to the lateral growth region, after the crystal layer is formed.

5. A method of manufacturing a nitride semiconductor device according to claim 1, wherein the crystal layer is formed through metal organic chemical vapor deposition (MOCVD).

* * * * *